(12) United States Patent
Zhang et al.

(10) Patent No.: US 12,300,494 B2
(45) Date of Patent: May 13, 2025

(54) ION IMPLANTATION PROCESS TO FORM PUNCH THROUGH STOPPER

(71) Applicant: Applied Materials, Inc., Santa Clara, CA (US)

(72) Inventors: Yan Zhang, Westford, MA (US); Johannes M. van Meer, Middleton, MA (US); Naushad K. Variam, Marblehead, MA (US)

(73) Assignee: Applied Materials, Inc., Santa Clara, CA (US)

( * ) Notice: Subject to any disclaimer, the term of this patent is extended or adjusted under 35 U.S.C. 154(b) by 610 days.

(21) Appl. No.: 17/548,002

(22) Filed: Dec. 10, 2021

(65) Prior Publication Data
US 2023/0187210 A1    Jun. 15, 2023

(51) Int. Cl.
*H01L 21/265*    (2006.01)
*H10D 64/01*     (2025.01)

(52) U.S. Cl.
CPC ......... *H01L 21/265* (2013.01); *H10D 64/017* (2025.01); *H10D 64/018* (2025.01)

(58) Field of Classification Search
CPC ........... H01L 29/42392; H01L 29/1083; H01L 29/66537; H01L 29/1079; H01L 29/0847; H10D 30/0217; H10D 62/371; H10D 30/501–509; H10D 30/43–435; H10D 30/014; H10D 62/119–123; Y10S 977/938
See application file for complete search history.

(56) References Cited

U.S. PATENT DOCUMENTS

2023/0012358 A1 *    1/2023   Liaw .................. H01L 29/41775

OTHER PUBLICATIONS

S. Scalese, M. Italia, A. La Magna, et al., "Diffusion and electrical activation of indium in silicon", Journal of Applied Physics 93, 9773 (2003), https://doi.org/10.1063/1.1572547, 11 pages.
Nagayama et al., "Suppression of Phosphorus diffusion using cluster Carbon co-implantation", 2010 IWJT, 4 pages.

* cited by examiner

*Primary Examiner* — Laura M Menz
*Assistant Examiner* — Candice Chan
(74) *Attorney, Agent, or Firm* — KDW Firm, PLLC (57) ABSTRACT

Approaches herein provide devices and methods for forming optimized gate-all-around transistors. One method may include forming a well by directing a first ion species into a substrate of a device, forming a plurality of alternating first and second layers over the well, and forming a dummy gate and a spacer over the plurality of alternating first and second layers. The method may further include removing a portion of the plurality of alternating first and second layers to expose an upper surface of the well, forming a punch through stopper in the well by directing a second ion species into the exposed upper surface of the well, etching the plurality of nanosheets to laterally recess the second layers relative to the first layers, and forming an inner spacer along the first and second layers.

20 Claims, 6 Drawing Sheets

ION IMPLANTATION PROCESS TO FORM PUNCH THROUGH STOPPER

FIELD OF THE DISCLOSURE

The present embodiments relate to semiconductor device patterning, and more particularly, to approaches for forming an improved punch through stopper using a source/drain cavity ion implantation process.

BACKGROUND OF THE DISCLOSURE

As integrated circuit (IC) technologies progress towards smaller technology nodes, multi-gate devices have been used to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors, both also referred to as non-planar transistors, are examples of multi-gate devices that provide high performance and low leakage applications. GAA transistors typically have a gate structure that can extend, partially or fully, around a channel region to provide access to the channel region on two or more sides. The channel region of GAA transistors may be formed from nanowires, nanosheets, or other nanostructures.

Successful integration of different multi-gate devices, including nanowire and/or nanosheet transistors, on one integrated circuit, is challenging. For example, dopant diffusion from source/drain (S/D) epi into the substrate reduces S/D electrical length (e-length) and therefore enhances punch-through leakage at a bottom of the active device. Blocking punch-through leakage current through the bottom parasitic channel is important for good device performance with continuous device scaling.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include forming a well by directing a first ion species into a substrate of a device, forming a plurality of alternating first and second layers over the well, and forming a dummy gate and a spacer over the plurality of alternating first and second layers. The method may further include removing a portion of the plurality of alternating first and second layers to expose an upper surface of the well, forming a punch through stopper in the well by directing a second ion species into the exposed upper surface of the well, etching the plurality of nanosheets to laterally recess the second layers relative to the first layers, and forming an inner spacer over the recessed second layers.

In another aspect, a method may include forming a well by directing a first ion species into a substrate of a device, forming a plurality of alternating first and second layers over the well, and forming a dummy gate and a spacer over the plurality of alternating first and second layers. The method may further include removing a portion of the plurality of alternating first and second layers to expose an upper surface of the well, forming a punch through stopper in the well by directing a second ion species and a third ion species into the exposed upper surface of the well, etching the plurality of nanosheets to laterally recess the second layers relative to the first layers, and forming an inner spacer over the recessed second layers In yet another aspect, a method of forming a punch through stopper of a device may include forming a well by directing a first ion species into a substrate of a device, forming a plurality of alternating first and second layers over the well, and forming a dummy gate and a spacer over the plurality of alternating first and second layers. The method may further include removing a portion of the plurality of alternating first and second layers to expose an upper surface of the well, forming a punch through stopper in the well by directing a second ion species and a third ion species into the exposed upper surface of the well, etching, after the punch through stopper is formed, the plurality of nanosheets to laterally recess the second layers relative to the first layers, and forming an inner spacer over the recessed second layers.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods, systems, and devices in accordance with the present disclosure will now be described more fully hereinafter with reference to the accompanying drawings, where various embodiments are shown. The methods, systems, and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously increase a source/drain (S/D) electrical length (e-length) to reduce punch-through leakage at a bottom of an active device by performing a S/D co-implant to form an enhanced punch through stopper. In some embodiments, the co-implant may include a heavy species (e.g., Indium) implant, resulting in less straggle and diffusivity than boron, for example. The co-implant may further include a carbon species to enhance activation. After performing the co-implant into the S/D cavity, both DC/AC performance may be improved compared to conventional well/PTS implants. Furthermore, embodiments herein provide reduced integration challenges and cost compared to partial or full bottom dielectric isolation (BDI) solutions.

Figure 1:
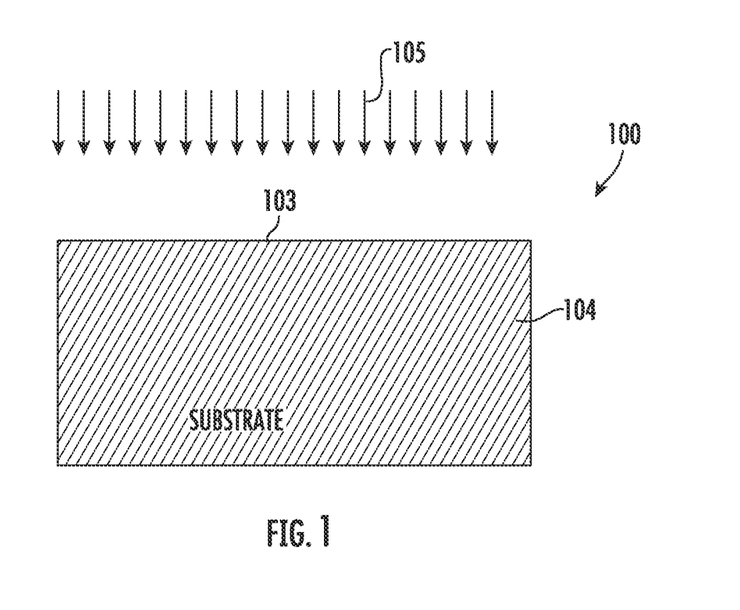
FIG. 1 illustrates a side cross-sectional view of a substrate of an exemplary device, according to embodiments of the present disclosure.
Figure 2:
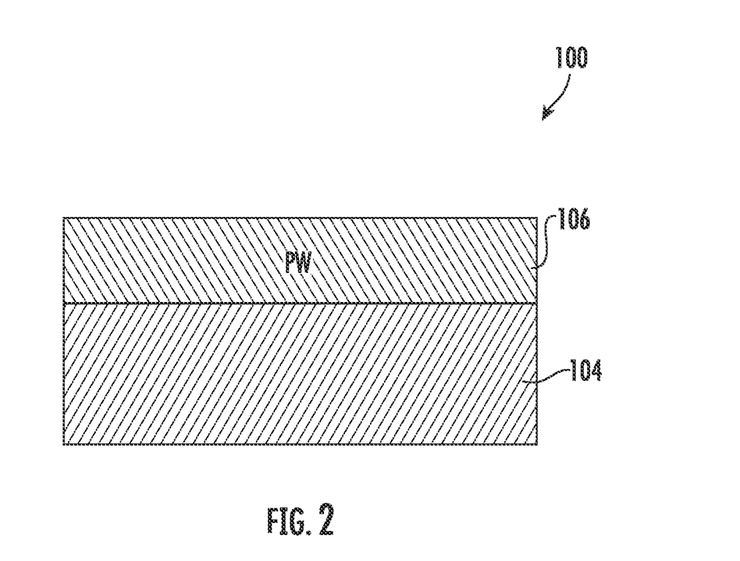
FIG. 2 illustrates a side cross-sectional view of a well formed in the substrate of the exemplary device, according to embodiments of the present disclosure.

FIG. 1 illustrates a perspective view of a semiconductor device (hereinafter "device") 100 at an early stage of processing, according to one or more embodiments described herein. The device 100 may be a GAA device structure, a vertical GAA device structure, a horizontal GAA device structure, or a nanosheet field effect transistor (FinFET) device structure. As shown, the device 100 may include a substrate 104 into which a first species (e.g., B) of ions may be directed or implanted as part of a first ion implantation process 105. In response to the first ion implant implantation process 105 to an upper surface 103 of the substrate 104, a well 106 may be formed in the substrate 104, as shown in FIG. 2. In some embodiments, the well 106 may be a P-type well. Although not shown, the well 106 may be formed using one or more patterned masks.

Figure 3:
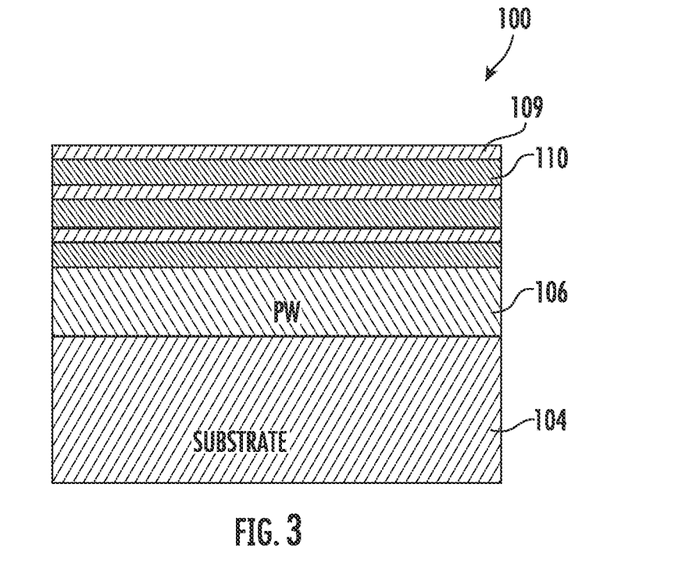
FIG. 3 illustrates a side cross-sectional view of a plurality of alternating first and second layers formed over the well of the exemplary device, according to embodiments of the present disclosure.

FIG. 3 demonstrates a plurality of alternating first layers 109 and second layers 110 formed over the well 106 and the substrate 104. In various embodiments, the plurality of alternating first layers 109 and second layers 110 may include two to ten first layers 109 and two to ten second layers 110. A composition of the first layers 109 may be different than a composition of the second layers 110 to achieve etching selectivity and/or different oxidation rates during subsequent processing, for example. In some embodiments, the plurality of alternating first layers 109 and second layers 110 may include different materials, different constituent atomic percentages, different constituent weight percentages, and/or other different characteristics to achieve desired etching selectivity.

In the present embodiment, the first layers 109 may include silicon (Si) and the second layers 110 may include silicon germanium (SiGe), which has a different etch selectivity than silicon. Although non-limiting, a thickness of each first layer 109 may be about 1 nm to about 10 nm, a thickness of each second layer 110 may be about 1 nm to about 10 nm, and the two thicknesses can be the same or different. Although non-limiting, the plurality of alternating first layers 109 and second layers 110 may be epitaxially grown in the depicted interleaving and alternating configuration, layer-by-layer, until a desired number of semiconductor layers is reached.

Although not shown, the first and second layers 109, 110 may be processed (e.g., etched) to form a plurality of structures, or nanosheets, extending in a vertical direction from the substrate 104. Each of the nanosheets may include an upper surface and a set of opposing sidewall surfaces. Adjacent nanosheets may be separated by a trench. The nanosheets may be patterned by any suitable method. For example, the nanosheets may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. Embodiments herein are not limited in this context.

Figure 4:
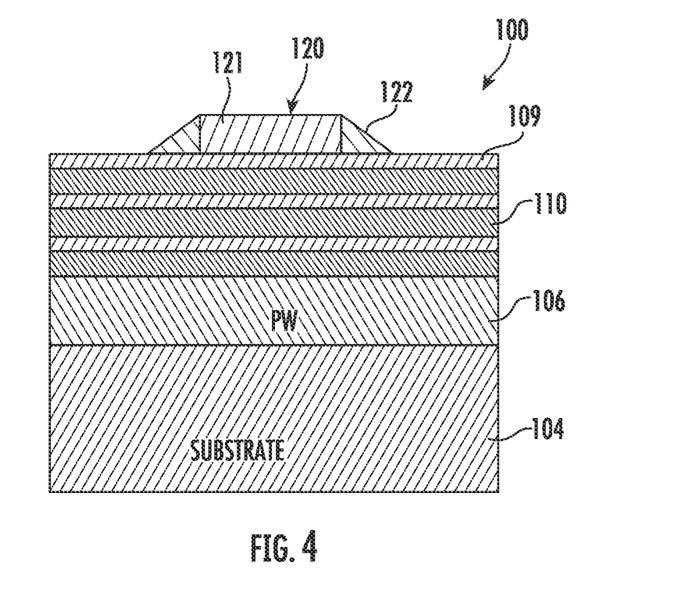
FIG. 4 illustrates a side cross-sectional view of a dummy gate and spacer formed over the plurality of alternating first and second layers of the exemplary device, according to embodiments of the present disclosure.

One or more dummy gate structures 120 may then be formed over the device 100, as shown in FIG. 4, e.g., atop an STI layer (not shown). In some embodiments, each dummy gate structure 120 is a sacrificial gate including a gate material layer 121 and a hardmask, wherein the gate material layer 121 may be formed atop an etch stop layer. In some embodiments, the gate material layer 121 may be an amorphous silicon (a-Si) or a polysilicon. The dummy gate structure 120 may further include one or more gate spacers 122 formed along a sidewall of the gate material layer 121. Although non-limiting, the gate spacers 122 may be formed of a dielectric material such as silicon nitride, silicon oxide, silicon carbo-nitride, silicon oxynitride, silicon oxy carbonitride, or the like, and may have a single-layer structure or a multi-layer structure including a plurality of dielectric layers.

Figure 5:
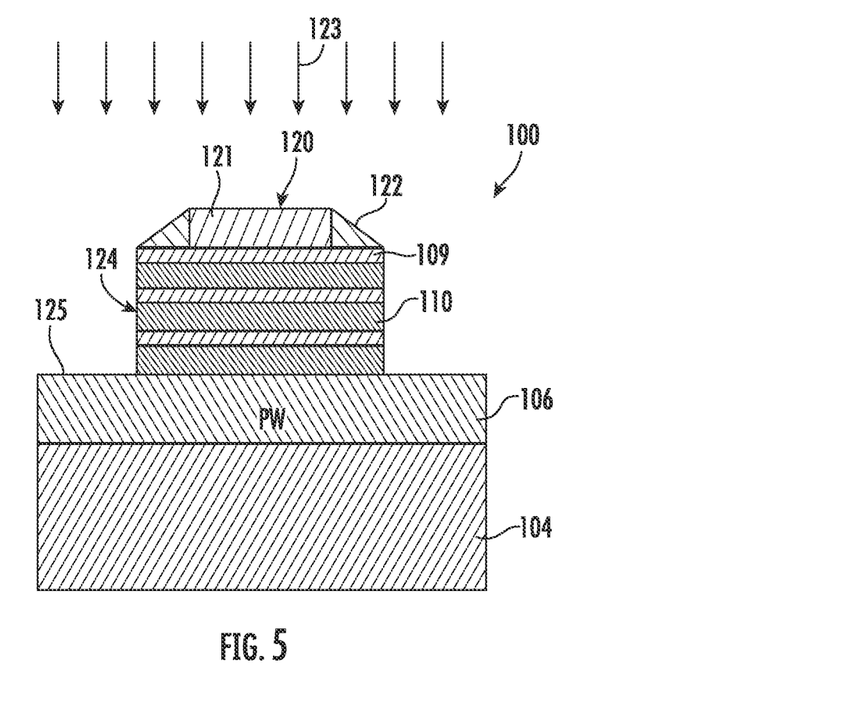
FIG. 5 illustrates a side cross-sectional view of the device following a source/drain cavity etch, according to embodiments of the present disclosure.

As shown in FIG. 5, a S/D cavity etch 123 may then be performed to expose a portion 124 of the nanosheets, namely, the plurality of alternating first layers 109 and second layers 110. Removing the first and second layers 109, 110 may also expose an upper surface 125 of the well 106. The etch 123 may be selective to the upper surface 125 of the well 106.

Figure 6:
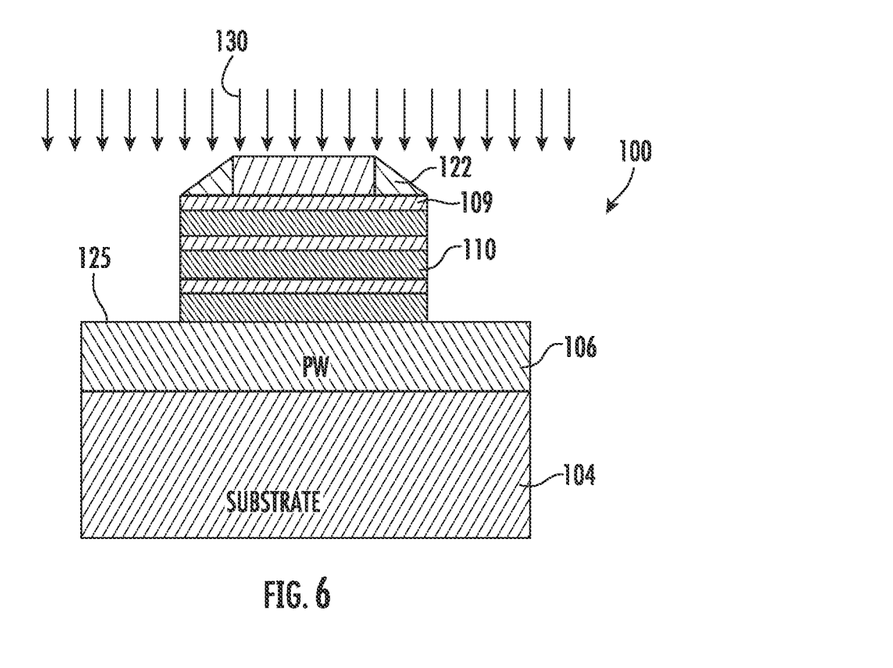
FIG. 6 illustrates a side cross-sectional view of the device during an ion implantation process, according to embodiments of the present disclosure.

A second ion implantation process 130 may then be performed, as shown in FIG. 6. More specifically, the second ion implantation process 130 may include directing a second ion species into the device 100, including into the exposed upper surface 125 of the well 106. In some embodiments, the second ion species may be a heavy species, such as Indium, which has less lateral straggle and less diffusivity than Boron, for example, and thus is less likely to be diffused into the channel region.

In some embodiments, the second ion implantation process 130 may further include directing a third ion species into the exposed upper surface 125 of the well 106. The third ion species may be any species that can enhance implanted dopant activation and suppress S/D dopant diffusion, such as carbon. In some embodiments, a pre-amorphization or cold implant may be part of the second ion implantation process 130 to further reduce straggle and improve dopant activation. Furthermore, in some embodiments, an annealing treatment may be performed after the second and third ion species are implanted into the well 106. Advantageously, no extra masking structures or steps are needed to perform the co-implant of indium and carbon.

Figure 7:
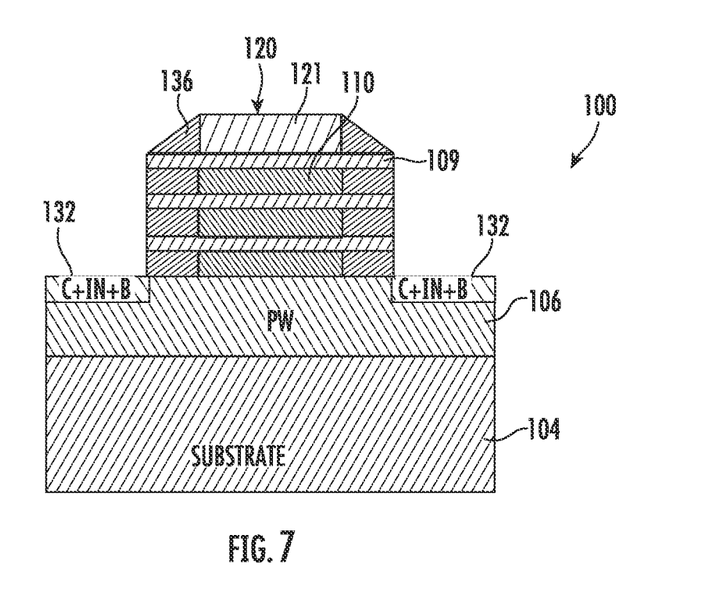
FIG. 7 illustrates a side cross-sectional view of the device following formation of a punch through stopper and an inner spacer, according to embodiments of the present disclosure.

As a result of the second ion implantation process 130, an enhanced punch through stopper (PTS) 132 may be formed in the well 106, as shown in FIG. 7. The PTS 132 may generally be formed along the upper surface 125 of the well 106, adjacent the first and second layers 109, 110. As a result of the first ion implantation process 105 (e.g., boron ions) and the second ion implantation process 130 (e.g., indium ions and carbon ions), the PTS 132 may include boron, indium, and carbon. It will be appreciated that the composition of the PTS 132 may vary depending upon the type of ion species selected.

As further shown, an inner spacer 136 may be formed along the first and second layers 109, 110. The inner spacer 136 may be in direct contact with both the first and second layers 109, 110. In some embodiments, an etch process may partially remove the second layers 110 relative to the first layers 109. For example, a lateral SiGe etch may be performed by a selective rapid plasma etch (SRP) device with onboard metrology (OBM), optimized to indent the second layers 110 to a desired horizontal depth/distance. Various etching parameters can be tuned to achieve selective etching of the second layers 110, such as etchant composition, etching temperature, etching solution concentration, etching time, etching pressure, source power, RF bias voltage, RF bias power, etchant flow rate, other suitable etching parameters, or combinations thereof. In some embodiments, the etch may be a selective isotropic dry etching process (e.g., a surface gas/radical reaction process) to the second layers 110 with a fluorine-containing gas (e.g., HF, $F_2$, $NF_3$, $CF_4$, $SF_6$, $CH_2F_2$, $CHF_3$, and/or $C_2F_6$). In some embodiments, a ratio of the fluorine-containing gas to an oxygen-containing gas (e.g., $O_2$), an etching temperature, and/or an RF power may be tuned to selectively etch the SiGe of the second layers 110.

Figure 8:
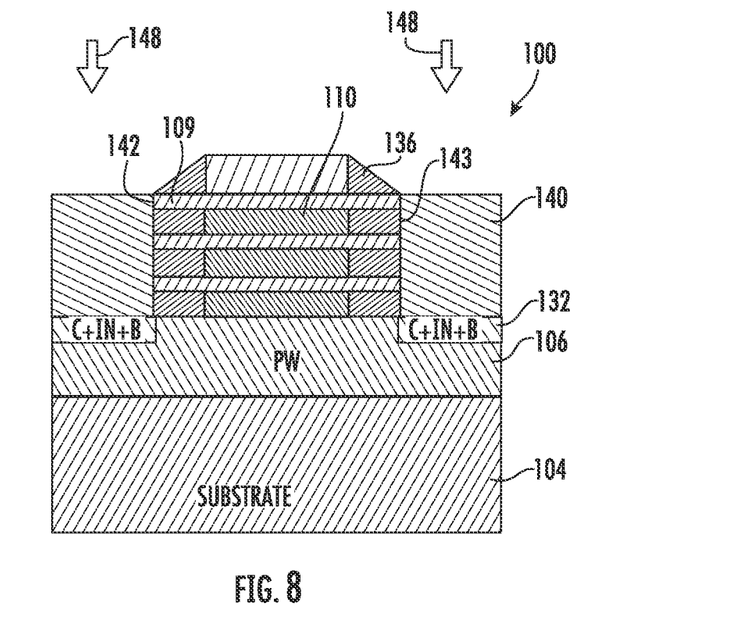
FIG. 8 illustrates a side cross-sectional view of the device following formation of a source/drain (S/D) epitaxial layer over the punch through stopper, according to embodiments of the present disclosure.

Next, as shown in FIG. 8, a S/D epitaxial region/layer 140 may be formed by selectively growing a semiconductor material adjacent the inner spacer 136 and over the PTS 132. In some embodiments, an epitaxy process may use chemical vapor deposition (CVD) techniques (e.g., vapor phase epitaxy and/or Ultra-High Vacuum CVD), molecular beam epitaxy, other suitable epitaxial growth processes, or combinations thereof, to form the S/D layer 140. The epitaxy process can use gaseous and/or liquid precursors, which interact with the composition of the substrate 104 (not shown) and the first layers 109. The S/D epitaxial layer 140 may be in direct contact with an outer surface 142 of the first layers 109 and in direct contact with an outer surface 143 the inner spacer 136.

In some embodiments, the S/D layer 140 may be doped with n-type dopants and/or p-type dopants. Although non-limiting, for n-type transistors, the S/D layer 140 may include silicon and can be doped with carbon, phosphorous, arsenic, other n-type dopant, or combinations thereof (e.g., forming Si: C epitaxial source/drain features, Si: P epitaxial source/drain features, or Si: C: P epitaxial source/drain features). For p-type transistors, the S/D layer 140 may include silicon germanium or germanium, and can be doped with boron, other p-type dopant, or combinations thereof (for example, forming Si: Ge: B epitaxial source/drain features). Further, the doping can be in-situ (i.e., doped during deposition by adding impurities to a source material of the epitaxy process) or ex-situ (e.g., doped by an ion implantation process subsequent to a deposition process). In some embodiments, an anneal 148 (e.g., rapid thermal anneal (RTA) and/or laser anneal) may be performed to the device 100 to activate dopants in the S/D layer 140.

Figure 9:
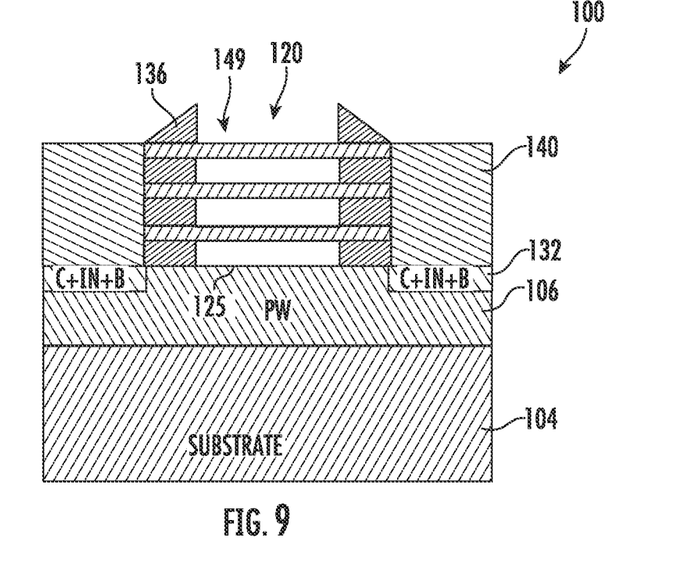
FIG. 9 illustrates a side cross-sectional view of the device following removal of the dummy gate, according to embodiments of the present disclosure.
Figure 10:
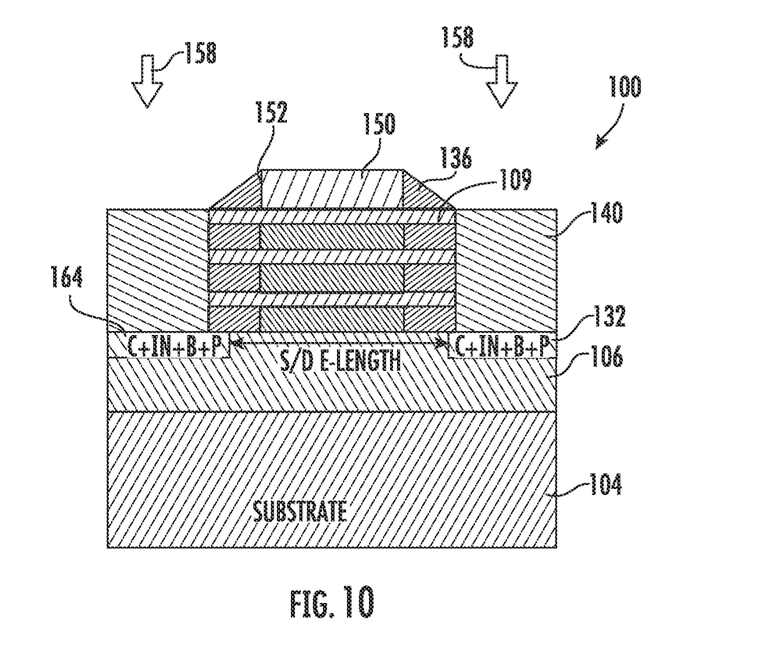
FIG. 10 illustrates a side cross-sectional view of the device following formation of a replacement gate, according to embodiments of the present disclosure.

Next, as shown in FIG. 9, the gate material layer 121 of the dummy gate structure 120 and the second layers 110 may be removed (e.g., etched) selective to the upper surface 125 of the well 106 to form a trench 149 within an interior of the inner spacer 136. The inner spacer 136, the S/D layer 140, and the first layers 109 may remain following the removal process. A gate material 150 may then be deposited within the trench 149, as shown in FIG. 10. In some embodiments, the gate material 150 may be a replacement metal gate refill deposited over the device 100 and then planarized (e.g., via CMP) or etched back selective to a top surface 152 of the inner spacer 136.

As further shown, the device 100 may then be annealed 158 after the gate material 150 is formed. Following the anneal 158, the PTS 132 may now include boron, indium, carbon, and S/D layer 140 dopant (e.g., P). Advantageously, in response to the first anneal (e.g., anneal 148 in FIG. 8) and the second anneal 158, indium activation is enhanced by the carbon, which in turn increases dopant concentration of the PTS 132 near a bottom surface 164 of S/D layer 140. Meanwhile, the carbon of the PTS 132 may further suppress or retard S/D layer 140 dopant (e.g., P) diffusion from the S/D layer 140 to the substrate 104. Therefore, S/D e-length in the well 106 is increased while punch through is decreased. Furthermore, both DC & AC performance can be improved (e.g., less parasitic leakage, Ioff and smaller parasitic capacitance).

Figure 11:
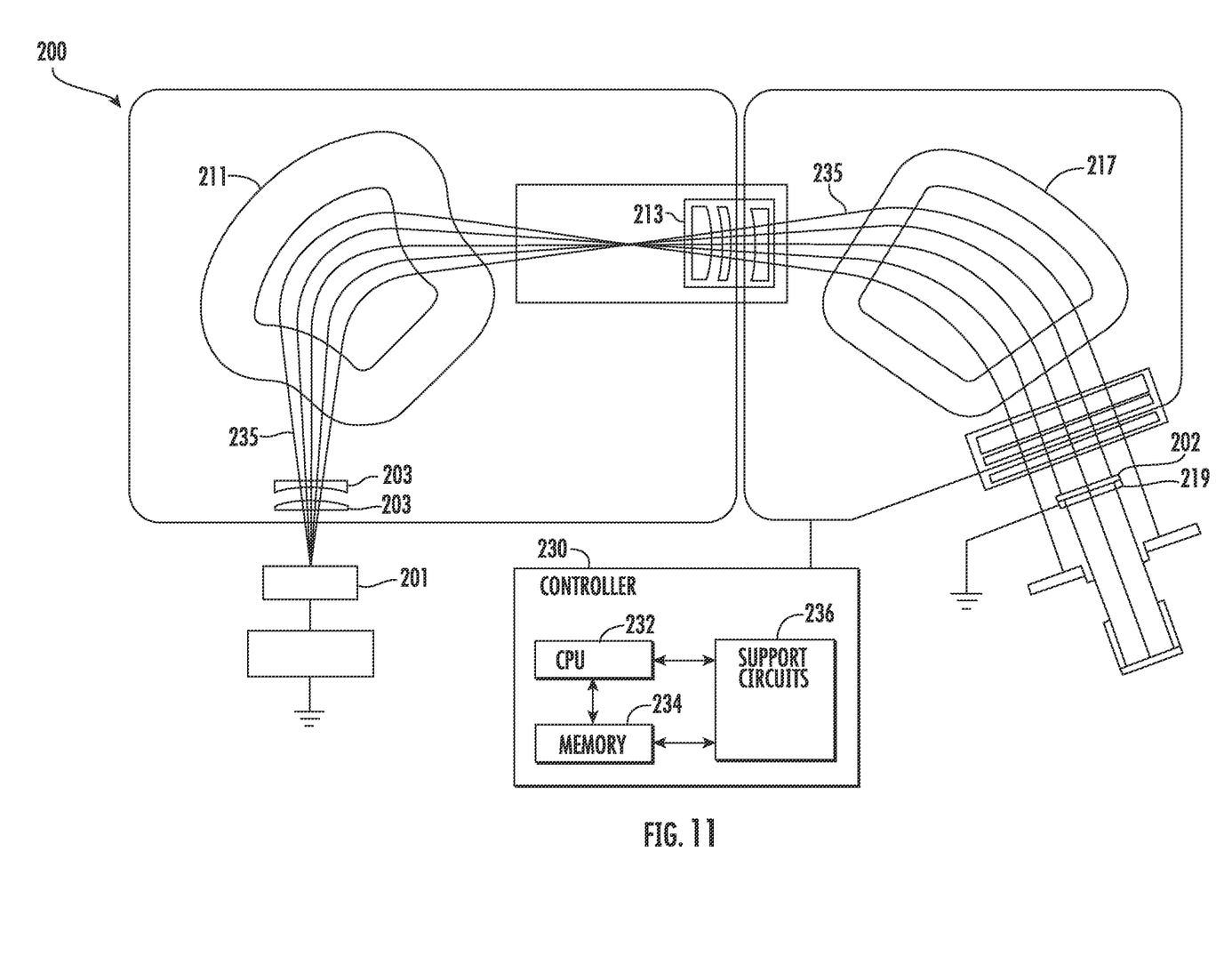
FIG. 11 is a schematic diagram of an exemplary system for forming the exemplary device, according to embodiments of the present disclosure.

FIG. 11 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the first and second ion implantation processes 105 and 130 described herein. The ion source 201 may also provide an ion etch, such as any of the etch processes described herein. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
    forming a well by directing a first ion species into a substrate of a device;
    forming a plurality of alternating first and second layers over the well;
    forming a dummy gate and a spacer over the plurality of alternating first and second layers;
    removing a portion of the plurality of alternating first and second layers to expose an upper surface of the well, wherein the exposed upper surface of the well is coplanar with a bottom of the plurality of alternating first and second layers;
    forming a punch through stopper in the well by directing a second ion species into the exposed upper surface of the well; and
    forming an inner spacer along the plurality of alternating first and second layers.

2. The method of claim 1, further comprising forming a source/drain epitaxial layer over the punch through stopper.

3. The method of claim 2, further comprising:
    annealing the source/drain epitaxial layer;
    removing the dummy gate;
    forming a gate material within the spacer after the dummy gate is removed; and
    annealing the device after formation of the gate material.

4. The method of claim 1, further comprising forming the punch through stopper in the well by directing a third ion species into the exposed upper surface of the well.

5. The method of claim 4, wherein the second ion species is indium, and wherein the third ion species is carbon.

6. The method of claim 1, wherein forming the inner spacer comprises:
    etching the plurality of alternating first and second layers to laterally recess the second layers relative to the first layers; and
    forming the inner spacer just along the second layers of the plurality of alternating layers.

7. The method of claim 1, wherein forming the plurality of alternating first and second layers over the well comprises forming a plurality of alternating layers of silicon and silicon germanium.

8. The method of claim 1, wherein the first ion species is boron.

9. A method, comprising:
   forming a well by directing a first ion species into a substrate of a device;
   forming a plurality of alternating first and second layers over the well;
   forming a dummy gate and a spacer over the plurality of alternating first and second layers;
   removing a portion of the plurality of alternating first and second layers to expose an upper surface of the well, wherein the exposed upper surface of the well is coplanar with a bottom of the plurality of alternating first and second layers;
   forming a punch through stopper in the well by directing a second ion species and a third ion species into the exposed upper surface of the well;
   etching the plurality of first and second layers to laterally recess the second layers relative to the first layers; and
   forming an inner spacer over the laterally recessed second layers.

10. The method of claim 9, further comprising forming a source/drain epitaxial layer over the punch through stopper.

11. The method of claim 10, further comprising:
   annealing the source/drain epitaxial layer;
   removing the dummy gate;
   forming a gate material within the spacer after the dummy gate is removed; and
   annealing the device after formation of the gate material.

12. The method of claim 9, wherein the second ion species is indium, and wherein the third ion species is carbon.

13. The method of claim 9, wherein forming the inner spacer comprises forming the inner spacer just along the second layers of the plurality of alternating layers.

14. The method of claim 9, wherein forming the plurality of alternating first and second layers over the well comprises forming a plurality of alternating layers of silicon and silicon germanium.

15. The method of claim 9, wherein the first ion species is boron.

16. A method of forming a punch through stopper of a device, comprising:
   forming a well by directing a first ion species into a substrate of a device;
   forming a plurality of alternating first and second layers over the well;
   forming a dummy gate and a spacer over the plurality of alternating first and second layers;
   removing a portion of the plurality of alternating first and second layers to expose an upper surface of the well, wherein the exposed upper surface of the well is coplanar with a bottom of the plurality of alternating first and second layers;
   forming a punch through stopper in the well by directing a second ion species and a third ion species into the exposed upper surface of the well;
   etching, after the punch through stopper is formed, the second layers relative to the first layers; and
   forming an inner spacer over the etched second layers.

17. The method of claim 16, further comprising:
   forming a source/drain epitaxial layer over the punch through stopper;
   annealing the source/drain epitaxial layer;
   removing the dummy gate;
   forming a gate material within the spacer after the dummy gate is removed, wherein the inner spacer is in direct contact with the gate material; and
   annealing the device after formation of the gate material.

18. The method of claim 16, wherein the first species is boron, wherein the second ion species is indium, and wherein the third ion species is carbon.

19. The method of claim 16, wherein forming the inner spacer comprises forming the inner spacer just along the second layers of the plurality of alternating layers.

20. The method of claim 16, wherein forming the plurality of alternating first and second layers over the well comprises forming a plurality of alternating layers of silicon and silicon germanium.

* * * * *